United States Patent [19]

Kroger

[11] 4,142,112
[45] Feb. 27, 1979

[54] SINGLE ACTIVE ELEMENT CONTROLLED-INVERSION SEMICONDUCTOR STORAGE CELL DEVICES AND STORAGE MATRICES EMPLOYING SAME

[75] Inventor: Harry Kroger, Sudbury, Mass.

[73] Assignee: Sperry Rand Corporation, New York, N.Y.

[21] Appl. No.: 794,430

[22] Filed: May 6, 1977

[51] Int. Cl.² .................. G11C 11/40; H01L 49/00; H03K 3/57

[52] U.S. Cl. .................................. 307/238; 357/6; 357/45; 365/180; 365/186; 365/231

[58] Field of Search .............. 307/238; 357/6, 45, 357/52; 365/148, 174, 180, 186, 230, 231

[56] References Cited

U.S. PATENT DOCUMENTS

| | | | |
|---|---|---|---|
| 3,623,029 | 11/1971 | Davidson | 365/180 |
| 3,761,896 | 9/1973 | Davidson | 307/238 X |
| 3,768,081 | 10/1973 | Asaoka et al. | 365/186 |
| 3,786,443 | 1/1974 | Mar | 307/238 X |
| 3,831,185 | 8/1974 | Kroger et al. | 357/6 |
| 3,831,186 | 8/1974 | Kroger | 357/6 |
| 3,979,613 | 9/1976 | Kroger et al. | 307/304 |
| 4,005,393 | 1/1977 | Schuerba | 365/230 X |

FOREIGN PATENT DOCUMENTS

1537181  1/1971  Fed. Rep. of Germany ........... 365/174

*Primary Examiner*—Larry N. Anagnos
*Attorney, Agent, or Firm*—Howard P. Terry

[57] ABSTRACT

Semiconductor storage switching circuits and integrated circuit storage array devices that employ them are characterized by the fact that each individual cell of the storage array requires only a single active device, each such active device consisting of a three terminal, controlled-inversion device of metal, non-linear resistor, and semiconductor layers, the active device having controllable switching characteristics through the use of silicon dioxide, polycrystalline silicon, or nitrides of silicon in its non-linear resistive layer. Control circuits associated with the memory arrays make possible the unique selection of any one predetermined cell to write, erase, or read its content. Grounded base and grounded emitter forms of the storage devices are provided, as well as random access memory devices.

8 Claims, 18 Drawing Figures

SINGLE ACTIVE ELEMENT CONTROLLED-INVERSION SEMICONDUCTOR STORAGE CELL DEVICES AND STORAGE MATRICES EMPLOYING SAME

The invention herein described was made in the course of or under a contract or subcontract thereunder with the United States Air Force.

BACKGROUND OF THE INVENTION

1. Field of the Invention

The invention generally relates to the field of semiconductor data storage devices and more particularly relates to semiconductor storage arrays and switching circuits for use therein in which a three terminal controlled-inversion device is the sole active element in each storage cell of the array.

2. Description of the Prior Art

Multi-terminal controlled-inversion semiconductor devices are found in the art and are characterized by an abruptly switchable transition in current-carrying capacity at a predetermined threshold condition. One such three electrode controlled-inversion device is described in the H. Kroger U.S. Pat. No. 3,979,613 for "Multi-Terminal Controlled-Inversion Semiconductor Devices", issued Sept. 7, 1976, and takes the general form of a multi-layer metal, non linear resistor, semiconductor device having current or voltage controllable switching characteristics through the use of certain nitrides of silicon in the non-linear resistive layer, the non-linear layer controlling the rate of injection of carriers with respect to their rate of removal by conductive flow through the layer when in its low impedance state. The threshold at which abrupt switching with respect to the high impedance state occurs is readily raised or lowered according to the magnitude and polarity of the voltage applied across the semiconductor interface. Polycrystalline silicon and silicon dioxide have also been successfully substituted for the nitrides of silicon used in the non-linear layer. Other materials may be substituted.

Devices of the type of the foregoing Kroger patent operate on certain of the principles earlier found useful in controlled-inversion bistable diode devices which are multi-layer metal, non-linear resistance, semiconductor devices or, alternatively, are metal, non-linear resistance, semiconductor barrier-emitter devices, both of which diode devices may be switched between two or more relatively stable impedance states. Such diode devices and circuits for their application are presented in the H. Kroger, H. A. R. Wegener U.S. Pat. No. 3,831,185 for a "Controllable Inversion Bistable Switching Diode", issued Aug. 20, 1974. Similar devices employing metal-barrier emitters and associated circuits are disclosed in the H. Kroger U.S. Pat. No. 3,831,186 for a "Controlled Inversion Bistable Switching Diode Device Employing Barrier Emitters", issued Aug. 20, 1974. In addition to describing the silicon nitride kind of controlled-inversion semiconductors and circuits for their employment, the aforementioned patents, all of which are assigned to Sperry Rand Corporation, disclose details of the structure and methods of manufacture of these multi-terminal bistable devices.

Both the silicon nitride devices and polycrystalline silicon and silicon dioxide multi-electrode bistable devices as will be described offer utility wherever rapid and reliable switching between two stable impedance states is desired and lend themselves to use in integrated circuits for which relatively low temperature fabrication may be employed, assuring reliability of the product. Having relatively high speed switching capabilities and relatively low power consumption, these new bistable devices afford extensive utility in such storage and logic devices as high packing-density memory arrays.

There are, of course, many types of reasonably competitive semiconductor storage array devices present in the art. None is simple and each has its particular beneficial attributes, but attendant difficulties are not generally avoided. For example, metal-oxide-silicon (MOS) storage devices are attractive for use in memory arrays because high packing densities and thus small memory arrays may theoretically be achieved; but such MOS memories are dynamic memories, so that the stored data must be refreshed periodically. Some of the theoretical size reduction of the array is therefore lost because complex data refreshing circuits must also be placed on the integrated memory circuit. There is a consequent undesirable demand for additional operating power. Bipolar storage arrays have been considered attractive because of their high operational speed; however, this high speed is achieved at the cost of a level of power consumption considerably higher than that of the MOS storage array. The art has not offered an entirely satisfactory high-density semiconductor memory array operating at a fully acceptable power level and also having other desirable characteristics, including ease of fabrication, and it is the object of the present invention to supply such devices employing certain of the principles taught in the aforementioned patents whereby advantageous storage devices are achieved using only one active semiconductor device per storage site.

SUMMARY OF THE INVENTION

The present invention relates to the application in semiconductor data storage arrays of controlled-inversion semiconductor switching devices having three terminals, devices which demonstrate an abruptly switchable transition in current-carrying capacity by virtue of the presence therein of a resistive non-linear impedance layer. The novel semiconductor storage arrays employing such controlled-inversion devices are characterized by the need for only one such active element in each individual cell of the storage array. Operation of such active elements depends upon the balance between the injection of carriers and their rate of removal by conduction through the non-linear impedance layer, which layer is composed of a nitride of silicon, silicon dioxide, polycrystalline silicon, or related material. Any one predetermined cell may be arbitrarily selected in the write, erase, or read operations of the memory array. Grounded base or grounded emitter forms of the invention are readily afforded, as well as other circuit configurations in which neither emitter nor base is precisely at the ground potential of the circuit.

DESCRIPTION OF THE PREFERRED EMBODIMENTS

Figure 1:
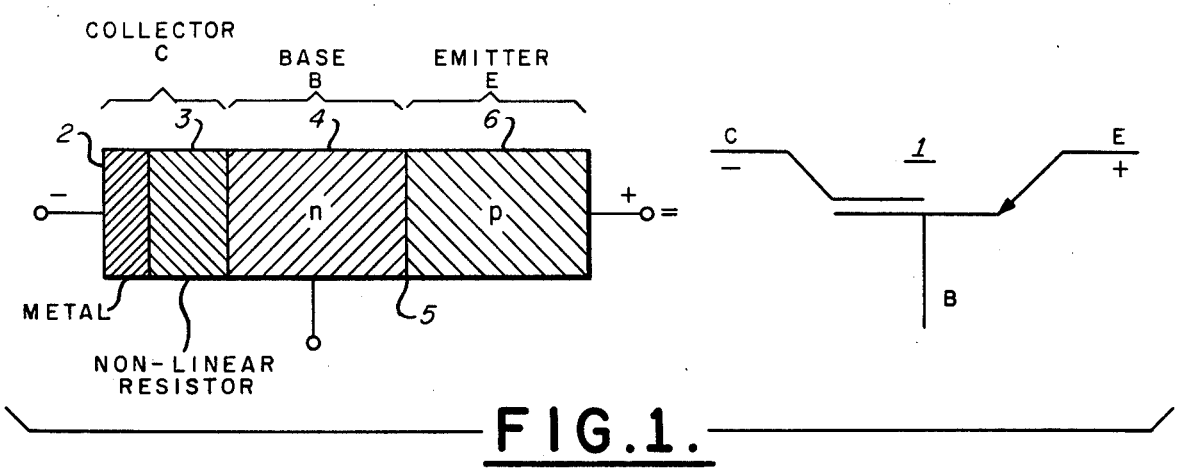
FIGS. 1 and 2 are elevation cross-section views of alternative forms of the invention and include a circuit symbol for each of the alternative forms.
Figure 2:
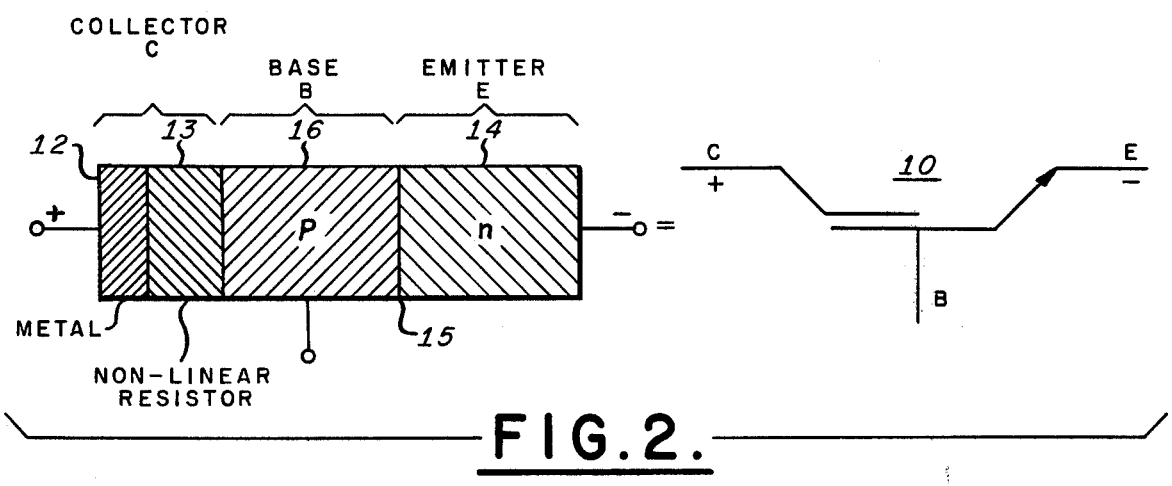

In the aforementioned Kroger U.S. Pat. No. 3,979,613, three-terminal, controlled-inversion semiconductor devices such as those of FIGS. 1 and 2 are presented. The seat of the advantageous bistable nature of these devices lies in the use of certain materials forming a non-linear resistor layer 3, which layer may include insulative materials such as silicon nitride, silicon oxynitride, silicon rich silicon oxynitride, or mixtures thereof, materials which herein will be generally called nitrides of silicon. Controlled methods for the formation of desirable layers of such non-linear resistive materials are similar to those well established in the representative art listed in the Kroger U.S. Pat. No. 3,979,613. As illustrated in the present FIG. 1, the controlled-inversion device includes such a non-linear resistive layer 3 placed on a semiconductor body including respective type n and type p conductivity layers 4 and 6 for forming between the latter a semiconductor interface 5 as described in U.S. Pat. No. 3,979,613. The non-linear resistive layer 3 is covered with a layer 2 of metal or other conductive material to which an ohmic lead is attached, a second such lead being coupled to type p semiconductor layer 6. It will be noted that other materials may be used in the non-linear resistive layer, including silica or polycrystalline silicon.

As seen in FIG. 2, the respective type n and type p or $p^+$ layers 4 and 6 of FIG. 1 may be interchanged with respect to their positions in FIG. 1 so as to form the respective layers 14 and 16 with a corresponding reversal of operating potentials. In the representative example of FIG. 1, the metallic layer 2 and non-linear resistive layer 3 form the collector C of the device, type n layer 4 is the base electrode B, and type p layer 6 acts as the emitter E. In the analogous arrangement of FIG. 2, the metal layer 12 and the non-linear resistive layer 13 again form the collector C, the type p layer 16 is the base B, and the type n layer 14 is the emitter E. For convenience in discussing the circuits of the present invention, FIGS. 1 and 2 also illustrate symbols 1 and 10 which will be used herein to represent the respective M-I-n-p and M-I-p-n devices of FIGS. 1 and 2.

Figure 3:
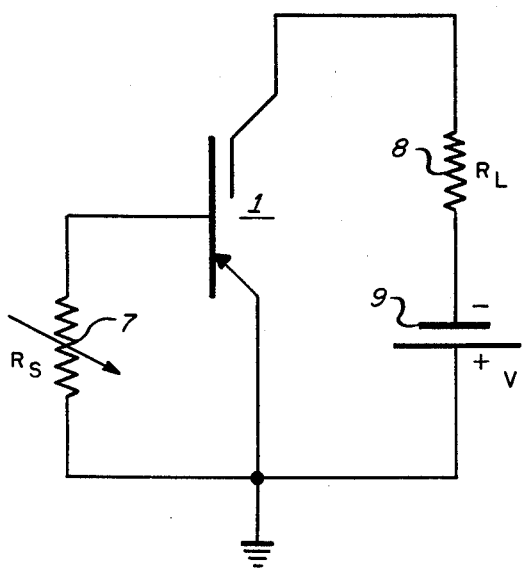
FIGS. 3 and 4 are alternate forms of circuits employing the respective FIG. 1 and 2 devices.
Figure 4:
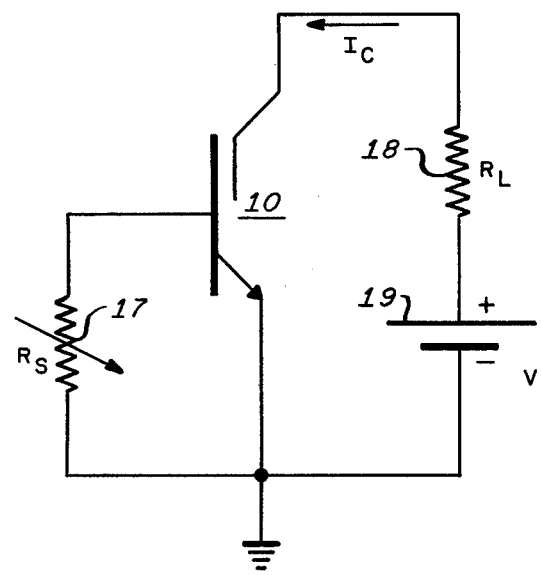

FIGS. 3 and 4 are representative circuits using the three-terminal controlled-inversion switches of FIGS. 1 and 2 in grounded emitter form which, according to the present invention, may be used conveniently and reliably to cause the devices of FIGS. 1 and 2 to switch from their lowest to a higher impedance state; this switching is accomplished, according to the present invention, without lowering the collector voltage supplied to the devices and without altering any component of the circuit connected to the collector of the device. The present invention thus extends the utility of the controlled inversion device from the function of switching from high to low impedance states to the function of switching from low to high impedance states. In this manner, the utility of the controlled-inversion devices is extended to use in random access memories and to integrated cross-bar switching circuits, for example.

It will be apparent that the invention may also be successfully practiced utilizing other types of controlled-inversion semiconductor devices, such as those in which the layered structure of the device is similar to that employing nitrides of silicon, but wherein polycrystalline silicon is used as the non-linear resistive material. The substituted polycrystalline layer 3 or 13 is applied to the semiconductor layer 4 and 16 using conventional techniques, as is also the case with the application of conductors 2 or 12 to the substituted layer. For example, the method employed to deposit polycrystalline silicon may simply involve placing the semiconductor body in a horizontal flow reactor at about 700° Centrigrade through which a flow of gas containing hydrogen as a carrier is employed along with a small amount of $SiH_4$ in argon gas, as well as a suitable dopant in hydride form. Gases such as $PH_3$ and $B_2H_6$ are representative hydride doping materials and may be used in a conventional manner to yield a non-linear resistive layer 3 or 13 having a resistivity of about $10^{-2}$ ohm-centimeters, for example. Silica non-linear resistor layers may be substituted using methods well known to those skilled in the art. Other materials may be used that are conductive enough to prohibit inversion without the actual presence of a conventional p-n junction.

Figure 5:
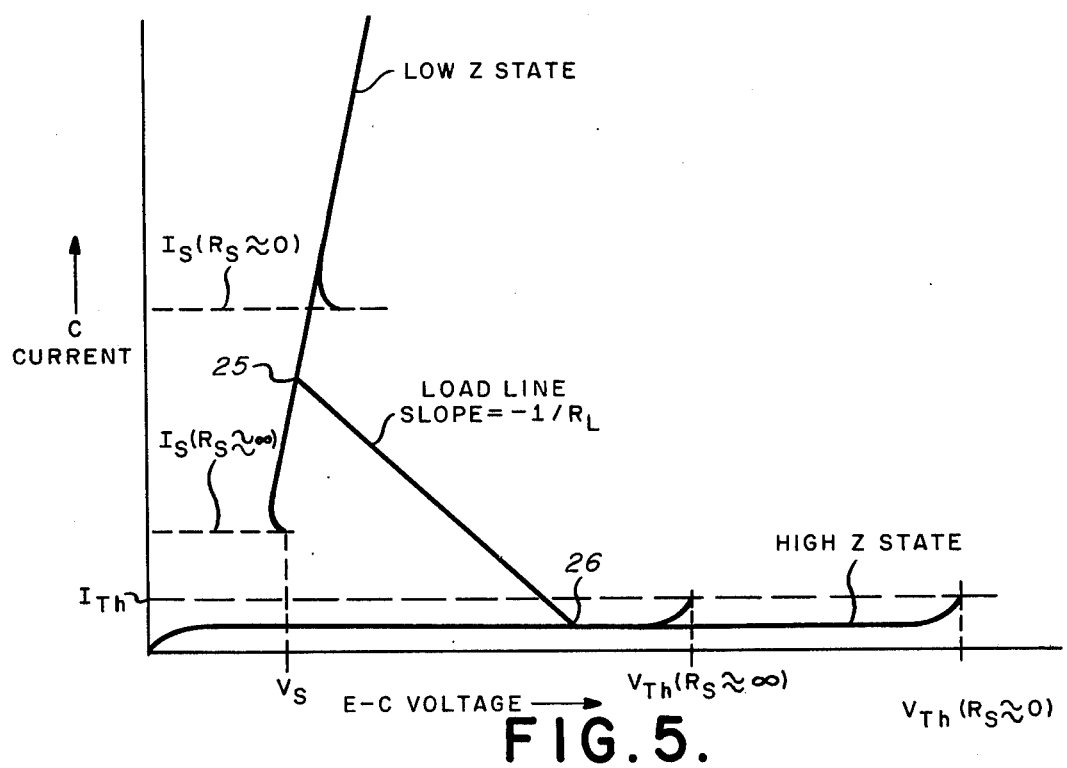
FIGS. 5, 6, and 7 are graphs useful in explaining the operation of the circuits of FIGS. 3 and 4.

As seen in FIG. 5, the maximum voltage which can be applied between the emitter and collector in the representative FIG. 4 circuit when the device is in its highest impedance state is the threshold voltage $V_{Th}$. In different designs of such circuits, $V_{Th}$ values as low as 2.5 volts and as high as 70 volts have been demonstrated according to experimentally selected device geometry and dopant levels. The diagram of FIG. 5 provides a graphic definition of $V_{Th}$ as well as that of the maximum current $I_{Th}$ which the device can carry in its highest impedance state. FIG. 5 also defines the sustaining current $I_S$, which is the minimum current that must be present to sustain the device in its lowest impedance state. The corresponding voltage $V_S$ is the voltage between emitter and collector at $I = I_S$. Emitter-collector current densities have been demonstrated for polycrystalline silicon devices of 1.6 amperes/cm.$^2$. Typical values of $V_S$ fall between 1.2 and 3 volts, for example. Devices employing silicon oxynitride non-linear layers have demonstrated values of $V_S$ of 1.2 volts, for example.

The lowest impedance state has no theoretical upper limit for the current which may be passed through the device, the upper limit being imposed in practice by irreversible damage to the device. Typical devices pass on the order of $10^3$ amperes per cm.$^2$ without damage; in one example, in which a silicon-rich silicon nitride non-linear layer was used and the base of the device was equipped in a conventional way with a copper heat sink, currents in excess of $8.3 \times 10^3$ amperes per cm.$^2$ were passed. In some circuit configurations and with some devices, an intermediate stable state lying between the low and high impedance states may be observed. Such a third stable state plays no beneficial role in binary logic and is normally eliminated by adjustment of the circuit load line using conventional techniques. The load line illustrated in FIG. 5, having a slope $-1/R_L$, shows a possible transition from the low to the high impedance state of the device brought about solely by changes in base circuit.

GROUNDED EMITTER CIRCUITS

Figure 7:
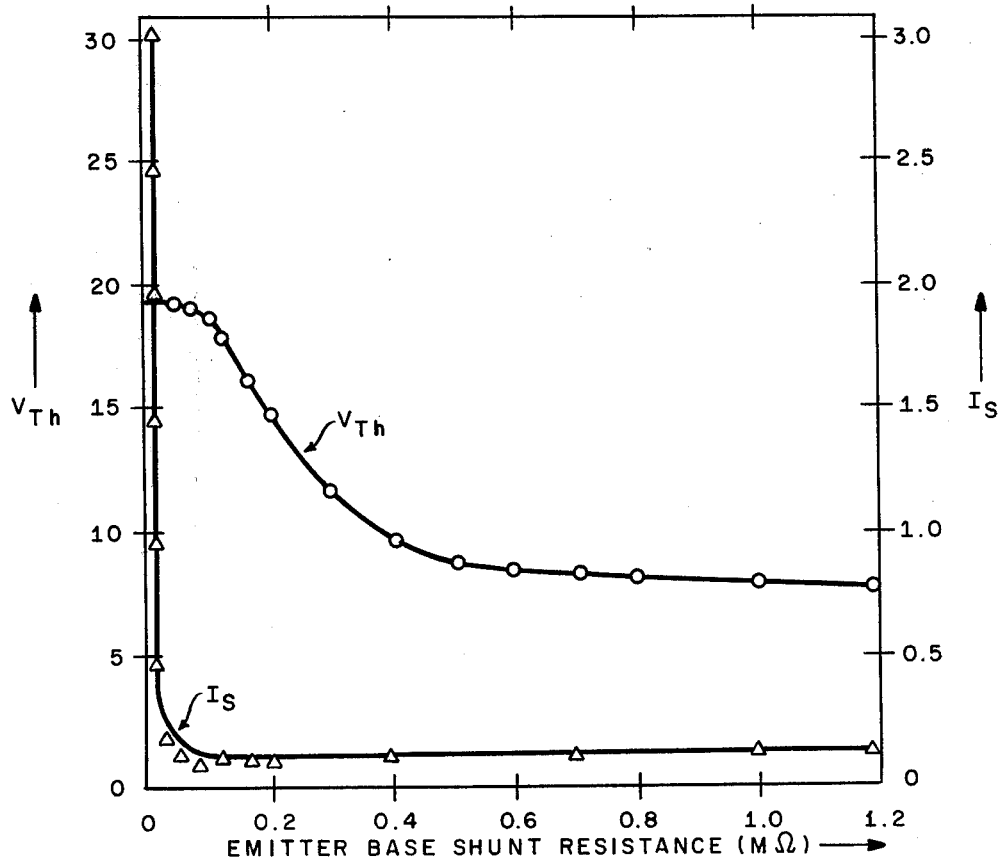
Figure 6:
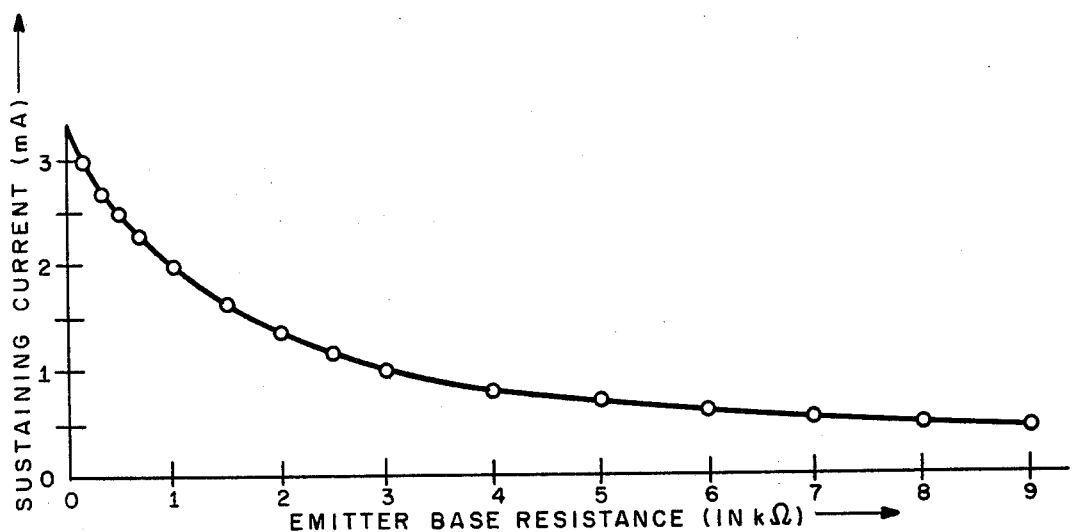

According to the invention, three beneficial changes occur when a shunt impedance $R_S$ such as the resistors 7 or 17 of the respective FIGS. 3 and 4 is placed between the emitter and base terminals of the controlled-inversion device. Both the sustaining current $I_S$ and the sustaining voltage $V_S$ for the low impedance state and the threshold voltage $V_{Th}$ for the high impedance are increased by the presence of the shunt impedance $R_S$. FIG. 6 is a graph for a representative device of experimentally derived sustaining current $I_S$ versus the emitter-base resistance for the circuit of FIG. 3. Similarly, experimental values of sustaining current $I_S$ and threshold voltage $V_{Th}$ for a metal-silicon dioxide-n-$p^+$ device in a grounded emitter circuit are plotted in FIG. 7 as a function of base current; note that the change in $I_s$ is very large compared to the change in $V_{Th}$.

Different ranges of $I_S$ and $V_{Th}$ characterize controlled-inversion devices having somewhat different structures. A maximum ratio of $I_S$ for $R_S$ substantially zero to $I_S$ for $R_S$ substantially infinity of 30 has been observed for metal $-SiO_2 - n - p - p^+$ devices; the minimum ratio of that quantity of 1.5 has been observed in metal-silicon oxynitride $p^+ - n - n^+$ (M-I-p-n) devices. In most device structures, the quantity $I_S$ changes by a factor of three to four when a low value of $R_S$ is used to shunt the emitter and base. The impedance $R_S$ can never in practice reach zero or infinity. Contact and interval spreading resistances prevent $R_S$ from attaining the zero value; leakage currents generally prevent $R_S$ from attaining an infinite value even without the addition of an external conductance to the circuit. Devices with low impedance states even where low values of $R_S$ are used have demonstrated a maximum value of 30 for the ratio of $V_{Th}$ for $R_S$ substantially zero to $V_{Th}$ for $R_S$ substantially infinity; these were metal $-SiO_2 - n - p^+$ devices. Such $V_{Th}$ ratios in the range of 1.5 to 6 are readily afforded. In most applications, relatively high values are desired for the $I_S$ ratio, values as high as possible (20 to 30) being preferred.

The important practical application in the circuits of the present invention of the variations of $I_S$ with the impedance $R_S$ is that a means is thereby provided for switching the controlled-inversion device out of its low impedance state without any lowering of the collector voltage or, in fact, without changing any part of the collector circuit. The only requirement is that the collector current (determined by $R_L$ and V in FIG. 4, for example) be not greater than the sustaining current $I_S$ for $R_S$ zero in the low impedance state of the device. As shown in FIG. 5, the transition along the load line from point 25 of the low impedance state to point 26 of the high impedance state is achieved without reducing $I_C$ to $I_S$ for $R_S$ substantially infinite. It will be understood by those skilled in the art that the variable shunt impedance $R_S$ in FIGS. 3 and 4 may be replaced in usual applications according to the invention by an electronically variable impedance, such as a conventional field effect or other transistor, or by another controlled-inversion device.

GROUNDED BASE CIRCUITS

Figure 8:
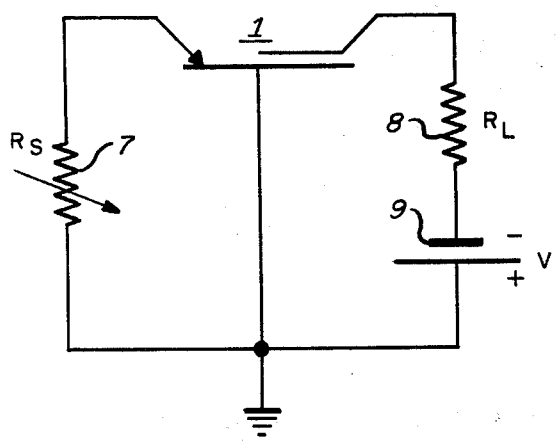
FIGS. 8 and 9 are alternative circuits employing the invention.
Figure 9:
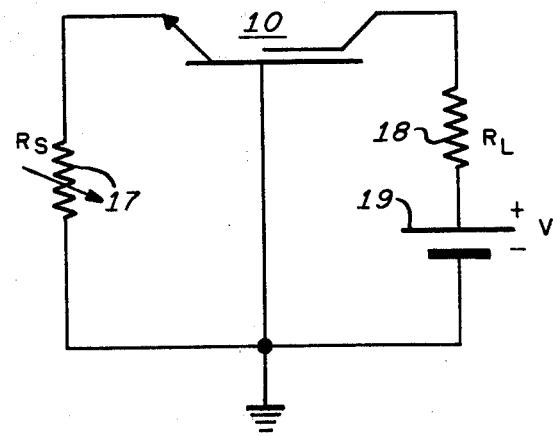

FIGS. 3 and 4 illustrate use of the invention in two forms of grounded-emitter circuits; in an analogous manner, FIGS. 8 and 9 illustrate corresponding grounded base circuits as will be apparent to those skilled in the art. Again, either M-I-n-p or M-I-p-n devices may be employed, as is shown by the respective devices 1 and 10, the respective connections of batteries 9 and 19 being reversed. It will become apparent that use of a shunt impedance 7 or 17 between the emitters and bases of such devices will again aid materially in switching the controlled-inversion device out of its low impedance state.

If controlled-inversion device is connected in a grounded base circuit configuration, there will be no transition into its low impedance state unless provision is made in the associated circuit to supply current into the emitter terminal. Collector break-down can actually be observed with an open-circuited emitter; switching to a low impedance state cannot be observed as will be apparent from the aforementioned art. Likewise, a device fabricated with no p-n junction and with no contact made to the semiconductor body by means of a non-injecting contact will show no low impedance state, even if the non-linear resistor and collector contact are those of an otherwise fully operable controlled-inversion device. It is clearly necessary to have a non-zero emitter current in order to produce the low impedance state, as is in positive agreement with the usual model for the controlled-inversion conduction process. This conclusion is applicable to the circuits of both FIGS. 8 and 9.

Figure 10:
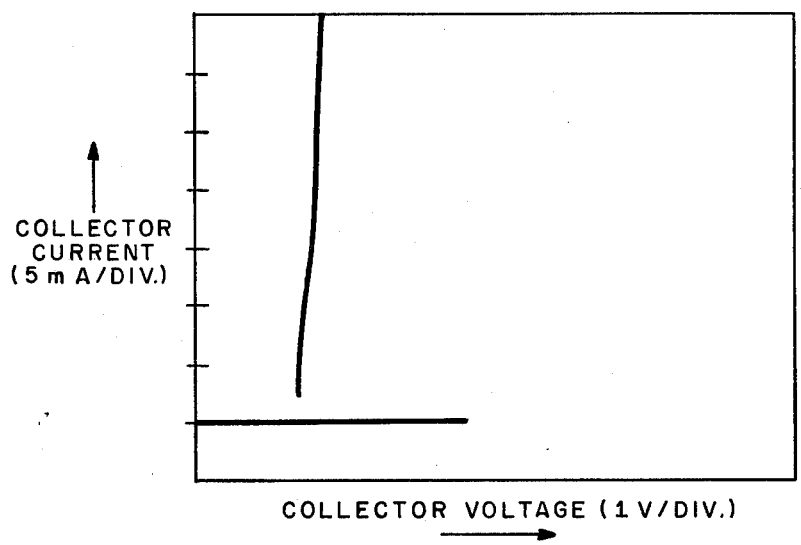
FIGS. 10, 11, and 12 are graphs useful in explaining the operation of FIGS. 8 and 9.
Figure 11:
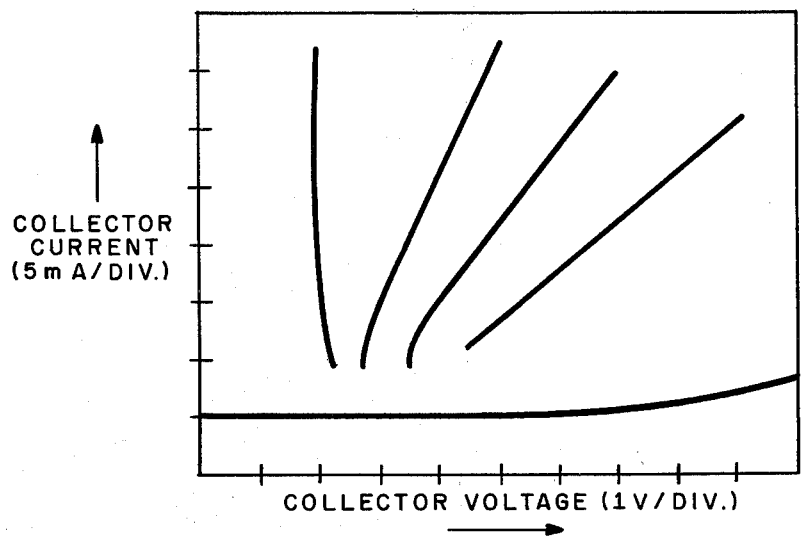

The desired finite emitter current is provided by the shunt $R_S$ coupled between emitter and base terminals as shown, for example, in FIG. 9. The experimentally derived open-base, grounded emitter current-voltage characteristics of a typical M-I-p-n device (actually a molybdenum-silicon-oxynitride-$p^+ - n - n^+$ structure) is shown in FIG. 10. For comparison purposes, the grounded base current-voltage experimental characteristics of the same device in a completed circuit are shown in FIG. 11, the latter characteristics being shown for four different values $R_S$ of the emitter-base-shunt impedance 17: $R_S$ = 0, 100, 200, and 400 ohms. For small currents in the low impedance state of the device, the differential resistance with the base grounded is slightly less than the value of $R_S$ used to generate the particular curve. The variations of the slopes of the current-voltage characteristic curves with the value $R_S$ is explained by the experimental observation that most of the collector current is drawn through the emitter terminal, even in the grounded base circuit. Some collector current is drawn through the base terminal, which latter provides a current path parallel to that of the emitter circuit, so that the slope is measurably less than $R_S$.

With $R_S$ greater than 1000 ohms in the same device and circuit, no transition to the low impedance state occurs. The effect of the emitter-base shunt for grounded base biasing is therefore generally opposite to the effect of a shunt impedance in grounded emitter circuits. Lowering the value of $R_S$ tends to cause devices with a grounded emitter to switch out of the low impedance state, whereas raising the level of $R_S$ tends to cause all grounded base devices to switch out of the low impedance state. The current-voltage characteristic for $R_S$ substantially zero are substantially identical to those for the grounded emitter circuit with $R_S$ substantially zero. Compared to the grounded-emitter characteristic shown in FIG. 10, $V_{Th}$ is increased from 4.5 volts to about 10 volts for $R_S$ substantially zero. However, the grounded base circuit threshold voltage $V_{Th}$ is advantageously substantially insensitive to variation of $R_S$ is contrast to the grounded emitter configuration. In order to switch the device out of the low impedance state by variation of the shunt $R_S$, a relatively precise adjustment of collector supply voltage is sometimes needed.

Figure 12:
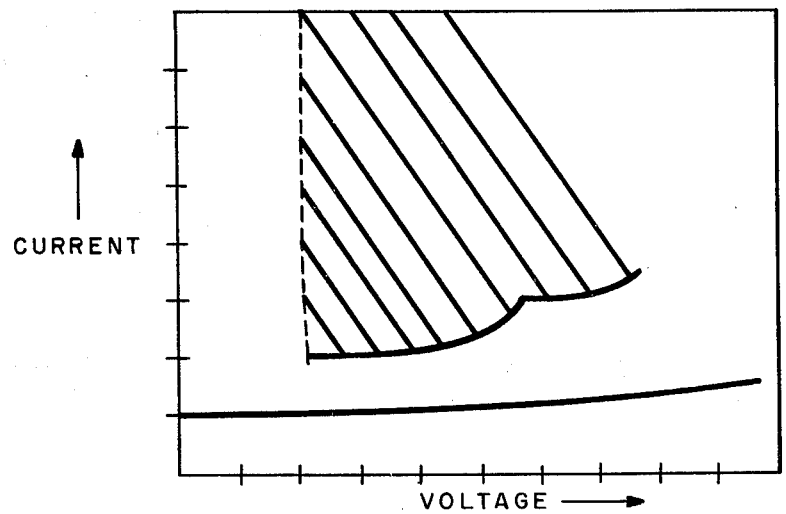

The grounded base configuration of the present invention advantageously removes the requirement for precise control of the supply voltage source 9 or 19. FIG. 12 presents curves illustrating how the aforementioned device can be removed from its low impedance state by variation of $R_S$. The data for FIG. 12 were again experimentally obtained; for each selected value of collector voltage, the value of $R_S$ was increased continuously until the device was switched out of its low impedance state. The several straight lines traced by this procedure are collector load lines and are parallel since they all correspond to a 150 ohm collector load resistance.

The parallel load lines terminate at the left side of the figure at the I-V characteristic curve corresponding to $R_S = 10$ ohms, the smallest value of $R_S$ used in the experiment. Their lower ends lie on a curve 25 defining the limit of the low impedance state. The I-V characteristic of the high impedance state is also shown in FIG. 12 to emphasize the presence of a gap between the lower limit to the current carried in the low impedance state and the current carried in the high impedance state. It is seen that collector supply voltages as low as 2.5 volts and as high as 12 volts may be used while still maintaining the capability of switching the device out of its low impedance state without changing any circuit component except $R_S$.

Figure 13:
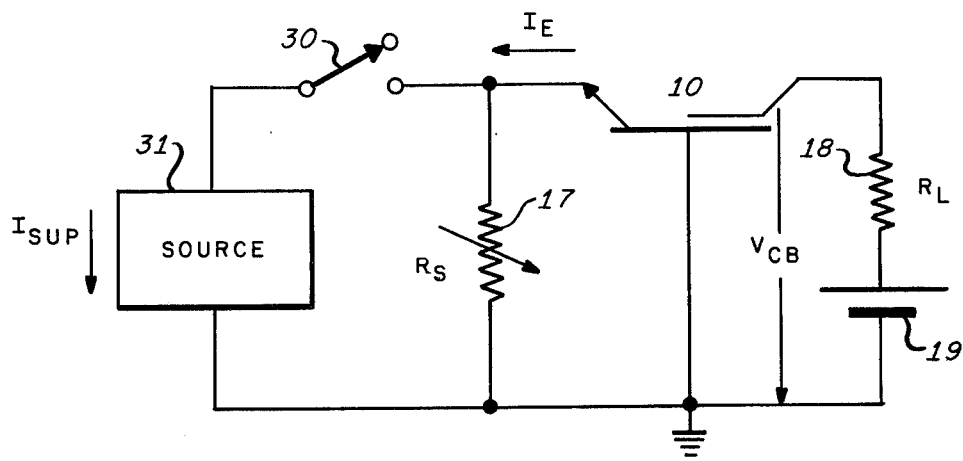
FIG. 13 is a further circuit utilizing the invention.

FIG. 13 is generally similar to FIG. 9 with the addition of a series connected switch 30 and a current source 31 coupled across the variable shunt resistor 17 and is intended to illustrate a significant attribute of the emitter-base shunt impedance $R_S$ in grounded-base circuits. If a current $I_E$ is supplied, by closing switch 30, to the emitter of device 10 as shown in FIG. 13, device 10 can switch to its low impedance state. If $R_S$ is substantially infinite, this impedance switching event is always a non-latching transition. With $R_S$ substantially infinite, the device collector current tends to saturate at $I_E$ for low collector current and low collector voltages. This particular choice of the shunt impedance $R_S$ involves the application of an emitter circuit with essentially no external conductance across the emitter-base terminals, and is the only configuration that has been found to result in possible damage to device 10 where an excessively large supply voltage is used in the collector circuit. The possible damage results from large current and voltage swings within the collector circuit, the circuit tending in this special circumstance to oscillate rather than to establish itself in a well defined low impedance state.

Figure 14:
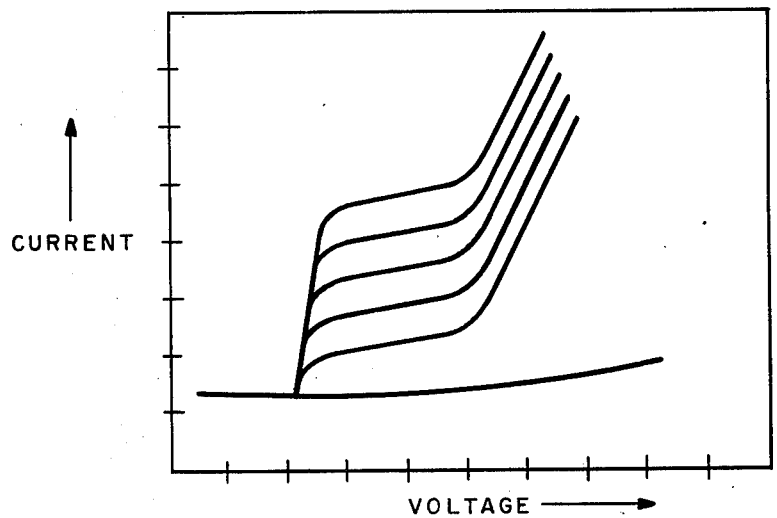
FIGS. 14 and 15 are additional graphs of value in explaining the operation of the invention.

On the other hand, if $R_S$ is finite, safe and repeatable switching takes place. For example, FIG. 14 presents graphs of several I-V characteristics of device 10 in its grounded-base connection with a 100 ohm shunt impedance $R_S$. The several characteristics are produced when a supply of source current $I_{SUP}$ of 0, 5, 10, 15, 20, or 25 milliamperes is fed to the parallel combination of the emitter and its inherent shunt resistance. Thus, the current steps represent more than just the emitter current $I_E$.

Figure 15:
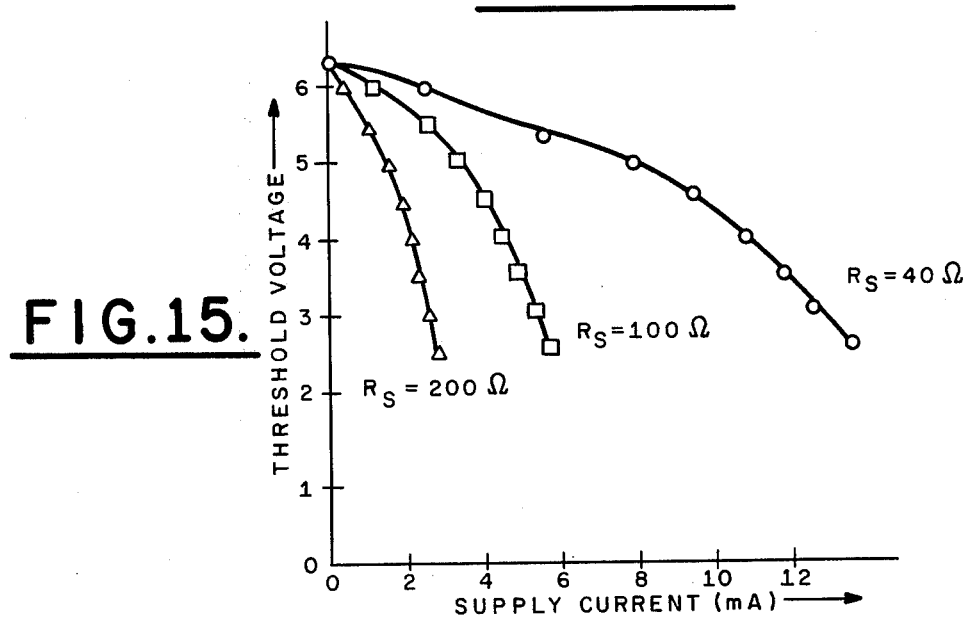

When the source current $I_{SUP}$ is finite, the steep, nonsaturating impedance curves at higher collector voltages shift to lower voltages, as shown in FIG. 14. The phenomenon is readily explained by recalling the fact to mind that most of the collector current must enter device 10 through its emitter terminal, which requires, when the source current $I_{SUP} = 0$, that the collector voltage be raised by an amount equal to $I_E R_S$. When $I_{SUP}$ is finite, some of the collector voltage is supplied directly by source 31 and, therefore, a smaller voltage develops across shunt impedance $R_S$. The collector threshold voltage with grounded-base biasing is reduced if any emitter current is supplied. The threshold voltage $V_{Th}$ is a function of the source current $I_{SUP}$ as seen in FIG. 15 for three different values of $R_S$ for a M-SiO$_2$ - p$^+$-n-n$^+$ device. Increasing the shunt impedance $R_S$ causes a greater fraction of the supply current $I_{SUP}$ to enter device 10 as emitter current, which accounts for the sensitive suppression of the threshold voltage $V_{Th}$ when larger values of shunt impedance $R_S$ are used. At high values of the source current $I_{SUP}$, the observed threshold voltage $V_{Th}$ approaches that of the grounded-emitter configuration.

SEMICONDUCTOR MEMORIES USING A SINGLE CONTROLLED-INVERSION DEVICE IN EACH MEMORY SITE

The described novel switching circuits are useful, for example, for organizing integrated circuit storage arrays, including random access memory array devices, in a particularly simple fashion, since the individual cells of such an array are readily accomplished using only one active controlled-inversion device per each memory cell. Low power consumption and high speed are readily achieved in the novel memory arrays. The associated memory circuits make possible the unique selection of any one arbitrarily selected cell device for write, erase or read operations.

Figure 16:
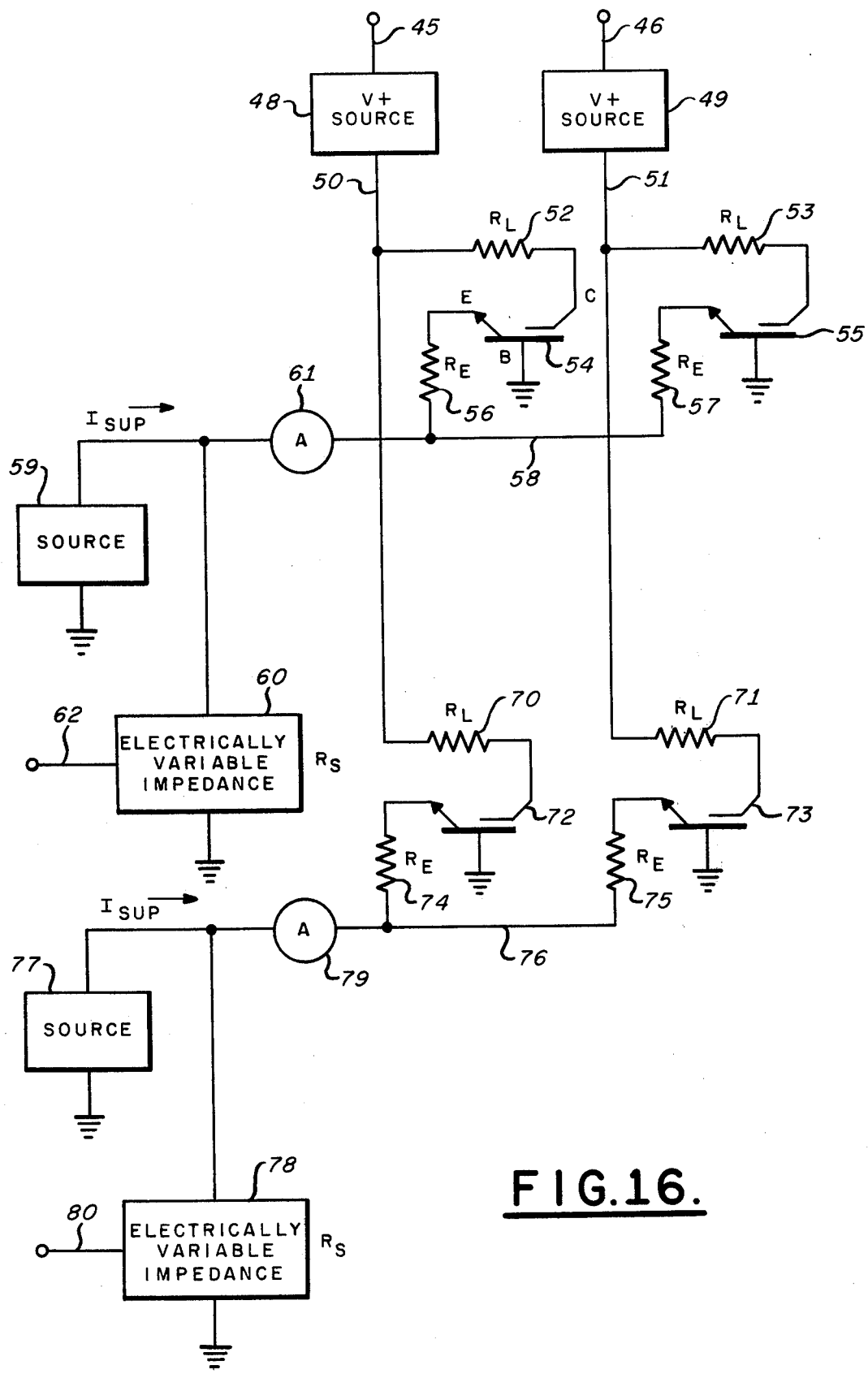
FIG. 16 is a grounded base form of a random access storage array according to the invention.
Figure 17:
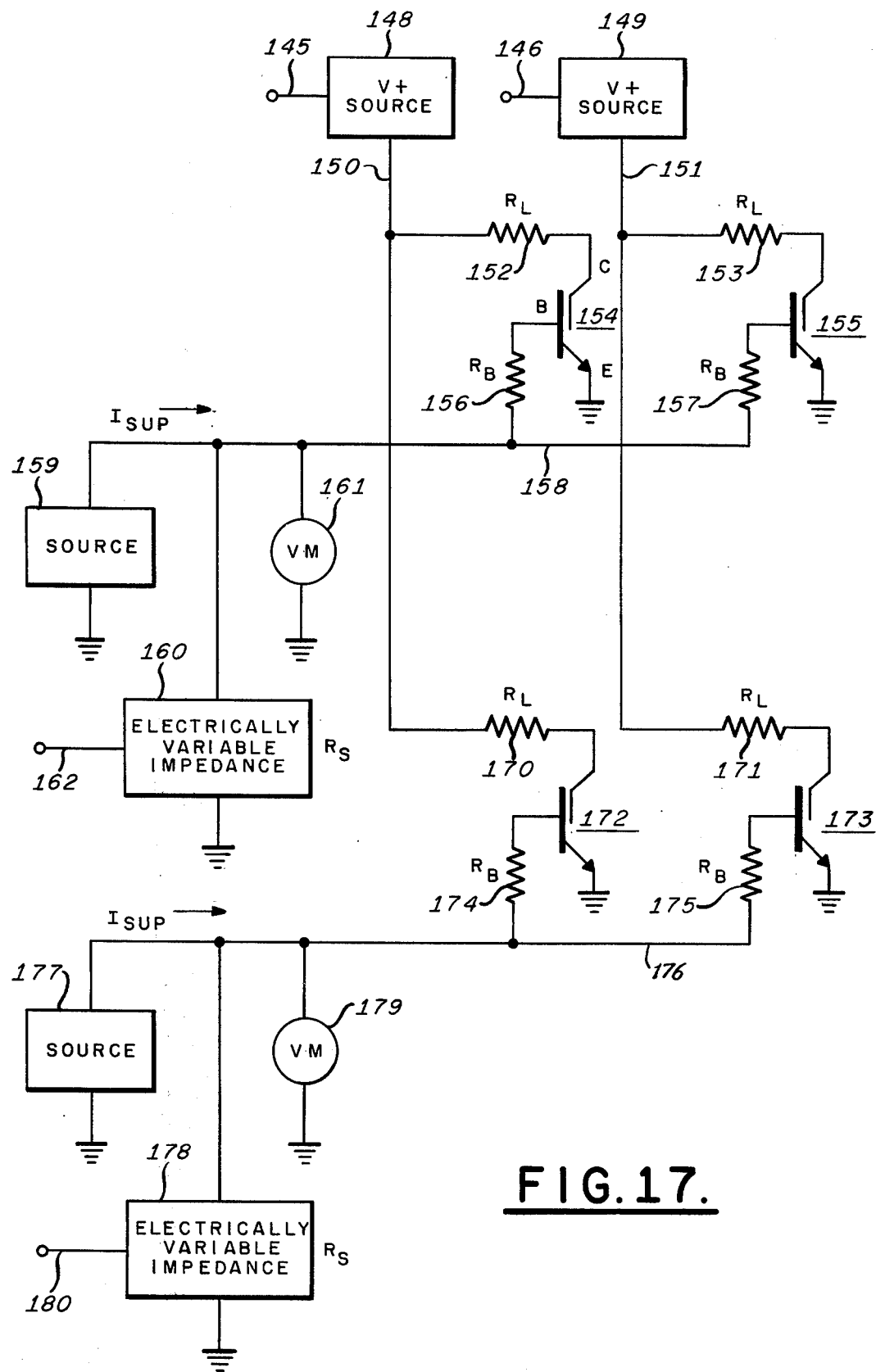
FIG. 17 is a grounded emitter version of the storage array alternative to that of FIG. 16.

FIGS. 16 and 17 respectively illustrate grounded base and grounded emitter versions of the novel memory arrays; while they are shown as utilizing M-I-p-n devices rather than M-I-n-p devices, either device functions well in the corresponding memory circuits, as will be recognized by those skilled in the art. The illustrated memory circuits features the possibility of selecting a single element constituting a predetermined memory cell for writing (by placing it in its low impedance state), for erasure (by returning the cell to its high impedance state), or for reading (by determining in which state the device resides), all utilizing the previously described properties of the device. The circuits additionally avoid undesired results often present in storage arrays whereby other cells in a row are undesirably erased when data is written into one device in that row. According to the present invention, circuit configurations and bias conditions are employed which prohibit such unwanted interactions by providing sufficient isolation for the cell devices.

While the circuits of FIGS. 16 and 17 are shown merely for the sake of simplicity in the form of two-by-two arrays, they clearly illustrate the essence of the invention and it will be fully apparent to those skilled in the art that regular arrays of much larger size and numbers of rows and columns may be generated directly from the present teachings. As a matter of convenience, circuit components in FIG. 17 that generally correspond to analogous components in FIG. 16 have the same reference numerals with one hundred added to them.

In FIGS. 16 and 17, load elements of impedance $R_L$, the base isolation resistors $R_B$ (FIG. 17), and the emitter isolation resistors $R_E$ (FIG. 16) aid isolation of the controlled-inversion devices from each other in their respective columns and rows. These resistors may be provided in integrated circuit forms of the invention by the surface deposition of thin layers of metal or of other conductors such as poloycrystalline silicon.

In the foregoing discussion of the three-electrode controlled-inversion devices 1 and 10, the variable shunt impedances $R_S$ have been illustrated as actual variable impedances or resistors, but it will be understood by those skilled in the art that they are not necessarily simple physical impedances. In fact, the devices 1 and 10 attain full utility when the shunt impedances $R_S$ actually represent the internal impedances between two conventional terminals of, for example, known active three-terminal semiconductor devices. Accordingly, $R_S$ may represent the electrically variable impedance between source and drain electrodes of a field effect transistor such as those commonly called JFET or IGFET transistors. Further, $R_S$ may represent the electrically variable impedance between the collector and the emitter of a conventional bipolar transistor switching device or even of another controlled-inversion device such as herein discussed. These variable shunt resistance or impedance elements are employed, according to the present invention, for selectively erasing the controlled-inversion device of a particular memory cell or in selecting a controlled-inversion device to be biased.

The actual magnitudes of the impedances $R_L$ and of resistors $R_B$ or $R_E$ of FIGS. 16 and 17 need not be large. In changing device 1 or 10 parameters, a useful scale of resistance is the ratio Z of the sustaining voltage $V_S$ to the sustaining current $I_S$ for the lowest impedance state of the device. It is possible to choose $R_L$ and $R_B$ (or $R_E$) so that $R_L/Z << 1$ and $R_B/Z << 1$ (or $R_E/Z << 1$). Choosing the lowest possible value of $R_L$ and $R_B$ (or $R_E$) ensures that the lowest possible power is dissipated to sustain the information stored in the memory array, as well as ensuring that minimum energy is dissipated in switching a memory cell from one impedance state to another. With low values of $R_L$ and $R_B$ (or $R_E$), the power dissipated in $R_L$ and $R_B$ (or $R_E$) is desirably small compared to the power dissipated within the controlled-inversion device itself.

THE GROUNDED BASE MEMORY ARRAY

In the grounded base memory array of FIG. 16, there is employed a plurality of individual controlled-inversion devices as discrete memory cells arranged in regular columns and rows. The storage array will generally extend for n rows and n columns. A representative cell l of the n by n storage array has a single active element, such as the controlled-inversion device 54. Its collector C is coupled through load resistor 52 via lead 50 to a controlled source 48 of V+ voltage, its base B is grounded, and its emitter E is coupled through emitter resistor 56 via lead 58 to signal source 59. As will be readily understood by inspection of FIG. 16, the array includes other controlled inversion cells such as those associated with the controlled-inversion storage devices 55, 72, and 73. All base electrodes are grounded. The collector C of device 55 is coupled through load resistor 53 and lead 51 to a second controlled source 49 of voltage V+, while its emitter E is coupled through emitter resistor 57 and through lead 58 to source 59. Similarly, the emitters of devices 72 and 73 are respectively coupled through emitter resistors 74 and 75 to source 77 through lead 76. The collectors of devices 72, 73 are coupled through the respective load resistors 70 and 71 to respective V+ controllable signal supplies 48, 49 via the respective leads 50 and 51. There will generally be n sources of V+ signals. Evidently, a single source may normally be used to perform the function of sources 59, 77, et cetera.

Leads 58 and 76 have coupled between them and ground respective electrically variable impedances 60 and 78 whose nature has been previously described. The magnitude $R_S$ of each of these controllable impedances is determined in the conventional way according to the selected storage site by control or addressing signals respectively applied to an array of leads such as leads 62, 80. In series connection in leads 58 and 76 are respective read-out devices 61, 79 which may take the form of conventional display elements or sensor elements for supplying signals to conventional digital processor utilization equipment. By way of example, conventional current meters may be used at 61 and 79 to allow visual sensing of the presence of current flow in the respective leads 58, 76, as suggested for simplicity in FIG. 16.

The grounded base array of FIG. 16 is a form of the invention that offers a simple mode of operation with high tolerances with respect to the amplitude of applied voltage pulses and resistance levels. In its write operation, a unique cell of the array is selectively transferred from its high to its low impedance state by the simultaneous application to that cell of two half-select pulses. Assume that the controlled-inversion device 73 lying in row i and column j of the array is to be written into. The two half-select operations lie in the substantially simultaneous application of an emitter current via the row i lead 76 and an increase in the voltage applied via the column j lead 51. A constant shape current $I_{SUP}$ pulse from source 77, for example, is provided to the parallel combination of the shunt variable impedance 78 and through the row i lead 76 and emitter resistor 75 to device 73. To protect device 73 from damage, the impedance $R_S$ is selected to be equal to or less than $V_S/I_S$. Thus, the combination of a relative increase in emitter supply current $I_S$ in row i of the device and a relative increase in the collector supply V+ along column j will cause the i, j device 73 to switch to its low impedance state. Write operation of other devices such as devices 54, 55, and 75 in other rows and columns of the array are analogous.

The operation of the grounded base array of FIG. 16 for selectively addressed erasure is dependent on the I-V characteristics of the controlled-inversion device, including changes which occur when the total emitter-base shunt impedance $R_S$ is varied. The value of $R_S$ for row i of the array is increased with simultaneous or at least overlapping relative decrease in the column j collector voltage V+ so as to erase the i, j device 73, for example. Alternatively, the erase operation may be achieved by an increase in the collector supply voltage for all columns except column j, together with an increase in $R_S$ for row i.

The two half-select voltage pulses thus result in the erasure of a desired device, such as the device 73 of row i and column j. The voltage V+ supplied by lead 51 to column j is reduced according to the control signal on lead 46, thus lowering the current flowing through all devices in column j (devices 55 and 72) in FIG. 16). As yet, no device can switch out of its low impedance state, because the current through all devices is above $I_S$. Now (essentially simultaneously, in practice), if the value of $R_S$ in row i is increased, the current $I_C$ for all devices in row i (devices 72, 73) will decrease as their voltage increases. The only row i device which can switch out of its low impedance state is the i, j device 73, for example, since only device 73 has a low collector voltage. The method of erasure permits the quiescent level of collector voltages to remain low, thereby reducing the power requirements for holding information in the memory array.

The read operation is achieved with ease in the grounded-base array of FIG. 16 because most of the collector current of each controlled-inversion device enters that device from the independently accessible emitter terminal. In order to perform the read operation with respect to device 73 in the i, j location, for example, it is necessary only to increase the collector supply voltage V+ on lead 51 of column j while simultaneously monitoring the current flowing through ammeter or sensor 79 in the row i lead 76. As previously noted, the ammeters 61 and 79, et cetera, will normally take the form of conventional current sensing elements for supplying signals to conventional external processor circuits which do not necessarily form a part of the present invention.

As has been noted, the array of FIG. 16 may be formed equally well with M-I-p-n or with M-I-n-p devices. In the read operation of an M-I-p-n device, for example, if the i, j device 73 is in its low impedance state, a large pulsed current increase will be observed in the ammeter of row i if the column j collector supply voltage is increased. In the read operation for an M-I-n-p device, if the i, j device 73 is in its low impedance state, then a large pulsed current decrease will be observed in the row i ammeter if the column j collector supply voltage is decreased. For either type of device, if the i, j device is in its high impedance state, then only an insignificant change in current is observed in the row i ammeter or sensor if the column j voltage is varied.

THE GROUNDED EMITTER MEMORY ARRAY

In the alternative grounded emitter form of the memory array shown in FIG. 17, there is employed a plurality of single active element memory cells again arranged in the characteristic manner in columns and rows. As previously observed, the array may extend for n rows and n columns. A typical cell of the multiple cell n by n array has as its single active storage element a discrete controlled-inversion device 154. Its collector C is connected through load resistor 152 via lead 150 to a controllable source 148 of V+ voltage, its emitter E is grounded, and its base B is coupled through base resistor 156 via lead 158 to source 159. As will be appreciated by inspection of FIG. 17, the novel regular array includes additional controlled-inversion device storage cells, at least including those associated with active memory devices 155, 172 and 173. All emitters are grounded. The collector C of device 155 is coupled by load resistor 153 via lead 151 to a second controllable source 149 of V+ voltage, while its base B is again coupled through base resistor 157 and lead 158 to source 159. In a generally analogous manner, the bases of devices 172 and 173 are coupled through the respective base resistors 174, 175 and through lead 176 to source 177. The collectors of devices 172, 173 are coupled through respective load resistors 170 and 171 to the respective controllable V+ supplies 148 and 149 connected to leads 150 and 151. It will be understood that there will generally be many (n) sources of V+ signals including sources 148, 149, et cetera, and that there may generally be many (n) sources including sources 159, 177, et cetera. In many applications, sources 159, 177, et cetera, will be one source.

Leads 158 and 176 have coupled between them and ground respective electrically variable impedances 160 and 178 whose nature has previously been discussed. The magnitude $R_S$ of each of these impedances 160, 178, et cetera, is controlled in the usual manner according to the desired storage location by a control signal applied, for instance, to lead 162 or to lead 180, et cetera. Also shunted to ground from leads 158 and 176 is a respective read-out device which may take any of several well known forms, including a sensor element in a computer circuit to be controlled by the sensed signal or displays such as the vacuum tube voltmeters represented at 161 and 179 by way of example, et cetera.

Application of a base current pulse lowers the threshold voltage $V_{Th}$ of a controlled-inversion device such as device 154. The efficiency of the application of a base current signal, for example, to row i of the array of FIG. 17 in order to cause a transition to the low impedance state is increased by having a high shunt impedance $R_S$ for row i. By this means, a larger fraction of the applied base current is then actually applied to the selected row i device, rather than being shunted to ground by a shunt impedance $R_S$ of low magnitude. A selective increase in $R_S$ of row i devices is not necessary, however, to cause some particular device in row i to make a transition to the low impedance state.

It will be seen that the selected device 173, for example, in row i and column j of FIG. 17 is brought into its low impedance state. For this purpose, the column j collector voltage V+ is increased above its quiescent value via lead 151. Simultaneously, or at least in an overlapping manner, a current pulse is applied to the row i lead 176. Since the suppression of the threshold voltage $V_{Th}$ is possible down nearly to $V_S$, one and only one device (the i, j device) is selected and makes a transition to its low impedance state.

The write operation is relatively simple for the grounded emitter array, since it is not even necessary to apply a base current along the row i conductor 176, for example, and the grounded-emitter threshold voltage $V_{Th}$ is a relatively sensitive function of the emitter-to-base shunt resistance. In order to switch, say, the i, j device to its low impedance state, all that is necessary is to lower the emitter-base shunt impedance for all other than row i and/or to raise the emitter-base shunt impedance for row i. If the collector voltage for column j is then raised to $V_{Th}$, only the i, j device 173 will convert to its low impedance state. The second reason for the simplicity of the grounded-emitter array in the write operation arises from the small degree of criticality in the collector pulse voltage amplitude when base current pulses are used.

With respect to the erase operation of the array of FIG. 17, the minimum current $I_S$ of the low impedance state is an increasing function of $R_S$. Removal of, say, the i, j device 173 from the low impedance state can then be accomplished simply by reducing the impedance 178 in row i and simultaneously lowering the collector supply voltage from source 149 of column j. It is necessary to lower the V+ voltage supplied to the selected column so that $I_C$ for the selected device i, j is less than $I_S$ for $R_S$ approaches zero, as shown in FIG. 5. All other collector supply columns are left with a sufficiently high V+ value that $I_C$ for those columns is greater than $I_S$ for $R_S$ substantially zero. Alternatively, if a low value of V+ resides at all columns in the steady state of the array (which simply holds the stored information), then to erase the i, j device 173, the voltage on all columns except column j is increased, with $R_S$ for column i being substantially simultaneously reduced.

In order to determine if a particular device of the FIG. 17 array is in its high or low impedance state, say the i, j device 173, it is possible to vary the collector voltage supply 149 of column j and to examine the voltage in the base row i, as is broadly represented by the vacuum tube voltmeter 179. As has been previously observed, voltmeters 161, 179, et cetera, will generally take the form of a known non-destructive read-out device such as an integrated resistor with an appropriate conventional voltage sensor coupled to appropriate stored data processor utilization circuits.

THE IMPROVED RANDOM ACCESS MEMORY

Figure 18:
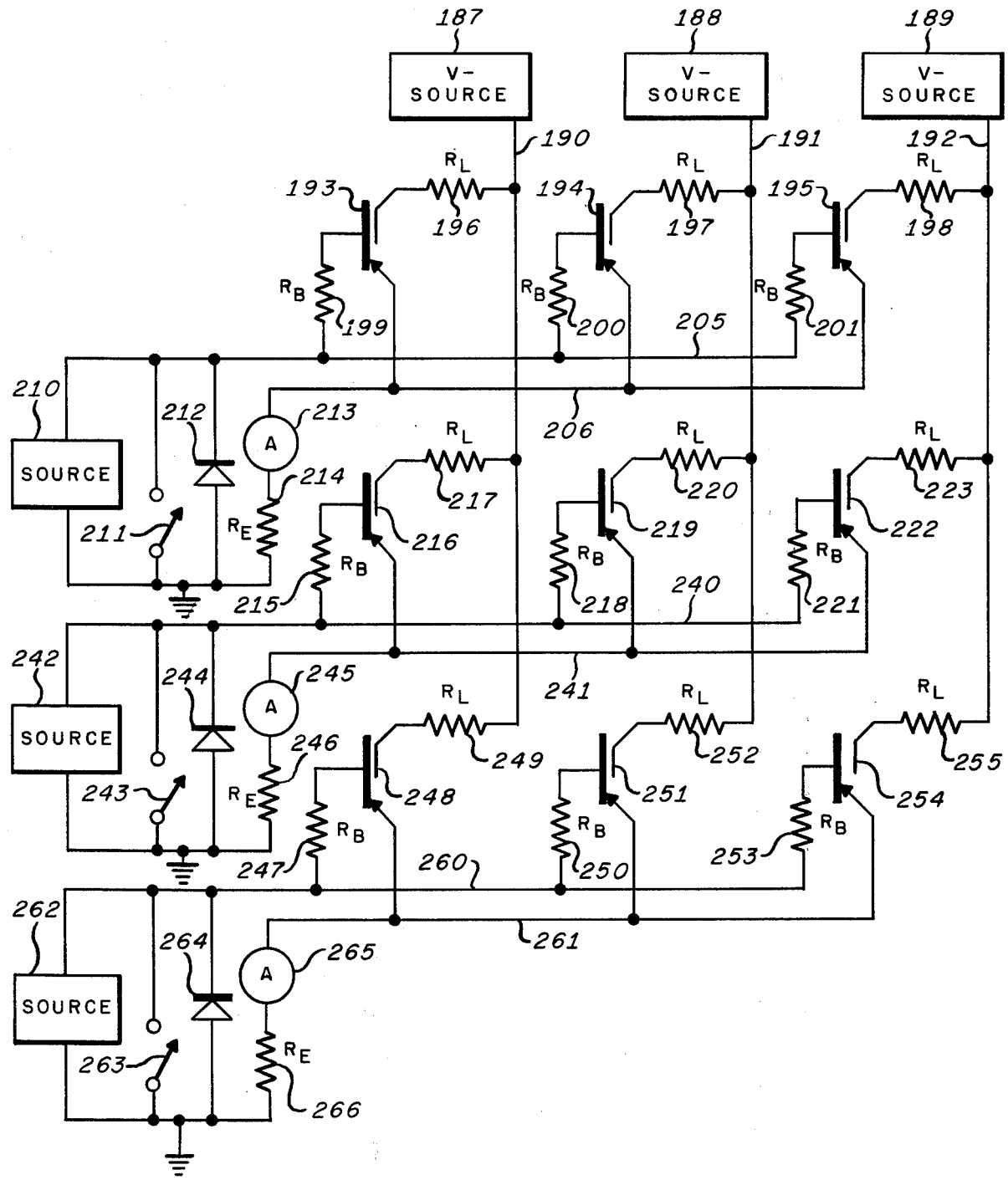
FIG. 18 is a further random access memory array employing the invention.

It is seen that the binary impedance characteristic of controlled inversion devices permits their application in simple integrated circuit memory arrays which require only a single active element per memory site and afford non-destructive read out. It has further been seen that the basic controlled-inversion element may be used to provide static random access memories with non-destructive read out. As seen in FIG. 18, an improved form of such a storage device may be realized, for example, in an M-I-n-p form, though other device arrangements are possible. The active controlled-inversion devices operate essentially in a grounded-emitter configuration, since the emitter resistors, having each a resistance $R_E$, are placed between emitter rows and ground in the lowest impedance level of the circuit. It will be particularly noted that the emitter rows are mutually isolated with respect to each other in the form of FIG. 18.

In more particular, there is employed in the improved random access memory of FIG. 18 a plurality of single, active, controlled-inversion memory cells again arranged in the characteristic manner in rows and columns. As previously observed, though three rows and three columns are now illustrated, the array will generally extend for n rows and n columns. A typical active cell of the multiple cell n by n array has as its single active storage element a discrete controlled-inversion device such as at 193. Its collector C is connected through load resistor 196 via lead 190 to a controllable source 187 of V - voltage, its emitter E through lead 206, sensor 213, and resistor 214 to ground, and its base B through base resistor 199 and through lead 205 to pulse source 210, thence to ground.

As will be appreciated from FIG. 18, the novel memory array includes additional controlled-inversion cells, at least including those associated with active memory devices such as controlled-inversion devices 194, 195, 216, 219, 222, 248, 251, and 254. The bases and emitters of devices 193, 194, and 195 are similarly respectively coupled to pulse source 210 and to sensor 213. In an analogous manner, the bases and the emitters of devices 216, 219, and 222 are respectively coupled to pulse source 242 and sensor 245. Further, the bases and emitters of devices 248, 251, and 254 are respectively coupled to pulse source 262 and sensor 265. Sources 210, 242, 262 are, like sources 59 and 77 of FIG. 16, pulsed sources; evidently, a single master source may be used to perform the several functions of sources 210, 242, 262, et cetera. While the collectors in the column including active elements 193, 216, and 248 are connected by lead 190 to a first source of V - voltage level, the collectors in the column including active elements 194, 219, and 251 are connected via lead 191 to a second source of V - level, and the collectors of the column including active elements 195, 222, and 254 are connected via lead 192 to a third source of V - voltage level. Respective switches 211, 243, and 263 and diodes 212, 244, and 264 (poled as shown) may be coupled in shunt across the respective sources 210, 242, and 262. Information is stored as a binary one if a particular active cell is in its low impedance state and as a binary zero if the cell is in its high impedance state. It will be understood by those skilled in the art that the switches 211, 243, 263 of FIG. 18 may be electronically controlled transistor or other such switches, and that the simple switches 211, 243, 263 may also be considered as convenient representations of the electrically variable impedances 160, 178, for example, of FIG. 17.

Storage capability of the device is readily demonstrated in several forms; in one form, M - SiO$_2$ - n - p$^+$ discrete devices were constructed, while in another, the devices were M-(silicon oxynitride)-p-n$^+$ devices. Both readily demonstrate the desired two stable impedance states. An important impedance level of each active cell is again $Z_0 = V_S/I_S$. For the example of the M-SiO$_2$-n-p$^+$ devices, $Z_0$ was $4 \times 10^3$ ohms, a value which can readily be made higher in easily fabricated small area devices. The devices are generally operated with $R_L/Z_0 << 1$ and $R_B/Z_0 << 1$.

Information is stored in a cell of the array by applying a holding current $I_C = f\, I_S$ to the collector C of every active device which is in its binary one state. For $f = 5$ or less, $V_C$ is about equal to $V_S$. Thus, the power P dissipated in each memory cell, as in the circuits of FIGS. 16 and 17, is:

$$P = fV_S I_S + R_L (fI_S)^2 + R_B I^2 B$$

The three terms in the right side of the equation respectively represent power lost in the active device itself, in the collector load resistance $R_L$, and in the base resistance $R_B$, respectively. Since reliable operation is readily demonstrated with $f = 2$, for example, the power dissipated in the load can be only six percent of that lost in the active device. Further power lost in the base resistance $R_B$ is negligible, since $I_B/I_C << 1/10$. The holding power requirement is easily reduced to 2.5 microwatts per memory site using conventional technology for fabricating small area devices. Sustaining power can readily be as low as one microwatt per bit in such small area devices.

The presence of the base resistance $R_B$ at any one active cell is in itself inadequate to ensure sufficient isolation of the several memory elements of an array. Additionally, if the $R_B$ values are increased beyond a certain limit, erase operation of the array may be hindered. Adequate isolation is ensured by adding the repective diodes 212, 244, 264 across the respective sources 210, 242, 262. The several diodes, in fact, cooperate with their associated base resistors, such as diode 212 and resistors 199, 200, 201, in providing the desired degree of isolation. The major effect of the diode associated with an individual active controlled-inversion device is to raise the device threshold $V_{Th}$ beneficially. Without the presence of the diodes, the threshold voltage of a given device is reduced incrementally for each active device in the same row that is already in its low impedance state. The inclusion of diodes 212, 244, 264 significantly and beneficially reduces the effect of active devices when in their low impedance states on the stability of the threshold voltages $V_{Th}$ of other active devices of the same row. In a cooperative manner, the presence of the emitter resistances $R_E$ causes the emitter potential to be brought even closer to that of the potentials of the bases and further reduces the change in the threshold voltage $V_{Th}$ of devices which happen not to be in their low impedance state. In fact, the value of $V_{Th}$ can be made essentially independent of the number of other active devices which are already in their low impedance state in a given row.

Operation of the random access memory array again includes the sub-operations of writing (changing a selected active device from its high to its low impedance state), erasing (changing a selected active device from its low to its high impedance state), and reading (determining in which state a selected active device resides without changing that state) and these operations are carried out by procedures which follow logically from the foregoing discussion. Throughout the following discussion, it will be assumed merely for convenience that the quiescent voltage $V_q$ applied to all columns of the array (via leads 190, 191, 192) is sufficiently great to hold all active devices in their low impedance state, regardless of the states of switches 211, 243, 263.

When exercising the write operation, a selected active controlled-inversion device in row i and column j of the array can be transferred directly from its high to its low impedance state without disturbing any other part of the array. First, a current $I_O$ is applied by one of sources 210, 242, 262 to the row i bases, resulting in the supply of a current I to each active device in the row. Next, or simultaneously, the voltage applied by one of leads 190, 191, 192 to column j of the matrix is raised above the threshold voltage $V_{Th}$; all other column voltages are left at the quiescent voltage level $V_q$. The array is then very simply returned to its stable holding state, with the device in row i, column j in its new low impedance state, by performing the reverse of the foregoing operations. First, the voltage applied to column j is dropped back to $V_q$ and, second (or simultaneously) the current applied to row i is withdrawn.

The presence of diodes 212, 244, 264 is beneficial in the write operation. There is negligible variation in $V_{Th}$ as additional active devices in a row are switched into their low impedance states. This desirable dynamic isolation would not be obtained in the simple circuit of FIG. 18 without the presence of diodes 212, 244, 264. It will be observed by those skilled in the art that it is both convenient and less power-consuming to write either an entire row or an entire column simultaneously, rather than writing each bit sequentially. The natural word order of the memory array of FIG. 18 is by column, rather than by row, because the erase and read out operations yet to be considered are more conveniently performed by column than by row.

Turning now to the erase operation is performed in the array of FIG. 18, a selected active controlled-inversion device, say, the one in row i and column j, is to be transferred from its low to its high impedance state without disturbing the remaining active elements of the array. First, a switch 211, 243, or 263 associated with row i is closed, but all other switches are left non-conducting. The negative voltage coupled to the one of leads 190, 191, or 192 which feeds column j is then or simultaneously reduced from the quiescent value $V_q$ to a new predetermined level $V_E$ such that the selected device is returned to its high impedance state. Again, the array is returned to its stable quiescent state by a reversal of these initial steps; i.e., the voltage on column j is raised to its quiescent level $V_q$ and then (or simultaneously), the closed one of switches 211, 243, or 263 is opened. To erase an entire column of the array of FIG. 18, it is necessary only to drop the column voltage to below the level $V_S$. Such a word length erase is attractive because less energy is dissipated in the array during word erase than would be required for holding the information within the array.

The read out operation is again accomplished simply by determining the low or high impedance state of the selected active controlled-inversion memory device say, the device in row i at column j of the array. For this purpose, the voltage of the column j lead is increased and the variation of current flowing through the associated row i ammeter or sensor of the several ammeters or sensors 213, 245, and 265 is measured or sensed. The current amplitude variation is larger by a factor of $10^2$ to $10^4$ when the column j, row i device is in its low impedance state than when it is in its high impedance state. It will be understood that it is also convenient to read out the information in an entire column simultaneously by examining the outputs of all ammeters or sensors 213, 245, and 265 simultaneously, rather than only one of the sensor devices. No more power is dissipated within the novel array of FIG. 18 to accomplish the read out of an entire word than is required to read out a single bit. Further, it should be recalled that neither read out by bit or by the whole word destroys the information stored in the array. Because of the isolation of emitter rows, the read operations is more easily performed than in the grounded base circuit of FIG. 16 or the grounded emitter circuit of FIG. 17.

CONCLUSION

Accordingly, it is seen that the invention is a novel data switching circuit and integrated circuit storage device of particularly uncomplex nature, each individual cell of a storage array according to the invention requiring but one active semiconductor device in the form of a three terminal multi-layered controlled-inversion device. Low power consumption and high speed are readily afforded in the novel memory arrays. Associated memory control circuit readily make possible the unique selection of any one arbitrary active cell device for write, erase, or read operations. Grounded base and grounded emitter operation of the storage devices are both easily demonstrated, being furnished with equal facility by integrated circuit devices. While the grounded emitter array consumes somewhat less power in holding stored information and in the write and erase operations, is relatively fast, and has wider tolerance of variation in voltage levels, it is the grounded base version of the invention which is preferred for many applications. The grounded base configurations are characterized by superior read and erase operations and are the most tolerant of variation in the properties of the individual active devices in the array. Also, the read operation produces a larger signal in the grounded base configuration than in the grounded emitter configuration. In the form of the invention providing isolation of emitter rows, the read operation is more easily performed than in the grounded emitter and grounded base variations of the invention. The invention provides simple random access memory arrangements with non-destructive read out, these requiring only one active controlled-inversion element per memory site.

While the invention has been described in its preferred embodiments, it is to be understood that the words which have been used are words of description rather than of limitation and that changes within the purview of the appended claims may be made without departing from the true scope and spirit of the invention in its broader aspects.

I claim:

1. A semiconductor memory device including a regular array of cells, each said cell comprising controlled-inversion semiconductor switching means having collector, base, and emitter electrode means and each characterized by first and second discrete impedance states between said collector and emitter electrode means, said base electrode means being coupled to ground, said semiconductor memory device further including:

voltage source means,
  load resistor means for coupling said voltage source means at least to said collector electrode means,
  current source means,
  emitter resistor means for coupling said current source means at least to said emitter electrode means, and
  selectively variable impedance means coupled in shunt relation with said current source means.

2. Apparatus as described in claim 1 additionally including sensor means for sensing the level of current flow through said emitter resistor means.

3. Apparatus as described in claim 2 wherein a selective increase in the voltage level of said voltage source means causes an increase in current flow through said sensor means only when said impedance state is a low impedance state and said controlled-inversion semiconductor switching means comprises M-I-p-n semiconductor means.

4. Apparatus as described in claim 2 wherein a selective decrease in the voltage level of said voltage source means causes a decrease in current flow through said sensor means only when said impedance state is a low impedance state and said controlled-inversion semiconductor switching means comprises M-I-n-p semiconductor means.

5. Apparatus as described in claim 1 wherein substantially simultaneous generation of signals by said current source means under control of said selectively variable impedance means and by said voltage source means transfers only said controlled-inversion semiconductor switching means from its high to its low impedance state, thereby performing the write operation within said cell.

6. Apparatus as described in claim 5 wherein substantially simultaneous increase of the impedance of said selectively variable impedance means and decrease of the voltage level of said voltage source means transfers only said controlled-inversion semiconductor switching means from its low to its high impedance state, thereby performing the erase operation within said cell.

7. A semiconductor memory device including at least a first row and a first column of active cells, each said active cell comprising controlled-inversion semiconductor switching means having collector, base, and emitter electrode means and characterized by first and second discrete impedance states between said collector and emitter electrode means, said semiconductor memory device further including:

voltage source means for said column,
current source means for said row,
plural load resistor means coupling each said collector electrode means in said column to said voltage source means,
plural base resistor means coupling each said base electrode means in said row to a first side of said current source means,
single emitter resistor means connecting each emitter electrode means in said row to a second side of said current source means,
  said current source means, said base resistor means, the base-to-emitter current path of said semiconductor switching means, and said emitter resistor means being disposed in series for each active cell,
selectively adjustable impedance means coupled in shunt across said current source means,
diode means coupled in shunt across said current source means,
said plural base resistor means and said diode means cooperatively effecting isolation of the active cells of said row whereby the operation of the row is independent of the number of the active cells of the row in their low impedance state.

8. Apparatus as described in claim 7 additionally including sensor means for sensing the level of current flow through each said emitter resistor means.

* * * * *